United States Patent
Otremba et al.

(10) Patent No.: US 10,204,845 B2
(45) Date of Patent: Feb. 12, 2019

(54) SEMICONDUCTOR CHIP PACKAGE HAVING A REPEATING FOOTPRINT PATTERN

(71) Applicant: Infineon Technologies Austria AG, Villach (AT)

(72) Inventors: Ralf Otremba, Kaufbeuren (DE); Amirul Afiq Hud, Melaka (MY); Chooi Mei Chong, Melaka (MY); Josef Hoeglauer, Heimstetten (DE); Klaus Schiess, Allensbach (DE); Lee Shuang Wang, Melaka (MY); Matthias Strassburg, Klagenfurt (AT); Teck Sim Lee, Melaka (MY); Xaver Schloegel, Sachsenkam (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/687,682

(22) Filed: Aug. 28, 2017

(65) Prior Publication Data
US 2018/0061745 A1     Mar. 1, 2018

(30) Foreign Application Priority Data

Aug. 31, 2016   (DE) ................ 10 2016 116 194
Feb. 21, 2017   (DE) ................ 10 2017 202 770

(51) Int. Cl.
*H01L 23/495*   (2006.01)
*H01L 23/31*    (2006.01)
(Continued)

(52) U.S. Cl.
CPC .... *H01L 23/49555* (2013.01); *H01L 23/3121* (2013.01); *H01L 23/49503* (2013.01);
(Continued)

(58) Field of Classification Search
None
See application file for complete search history.

(56) References Cited

U.S. PATENT DOCUMENTS 4,780,795 A * 10/1988 Meinel ................. H01F 17/062
                                              174/538
5,491,360 A *  2/1996 Lin .......................... H01L 24/49
                                              257/670
(Continued)

FOREIGN PATENT DOCUMENTS

DE            10205563 A1    8/2003
DE        102007036345 A1    3/2008
(Continued)

*Primary Examiner* — Lex Malsawma
(74) *Attorney, Agent, or Firm* — Murphy, Bilak & Homiller, PLLC

(57) ABSTRACT

A semiconductor chip package includes a semiconductor chip disposed over a main surface of a carrier. An encapsulation body encapsulates the chip. First electrical contact elements are electrically coupled to the chip and protrude out of the encapsulation body through a first side face of the encapsulation body. Second electrical contact elements are electrically coupled to the chip and protrude out of the encapsulation body through a second side face of the encapsulation body opposite the first side face. A first group of the first electrical contact elements and a second group of the first electrical contact elements are spaced apart by a distance D that is greater than a distance P between adjacent first electrical contact elements of the first group and between adjacent first electrical contact elements of the second group. The distances D and P are measured between center axes of electrical contact elements.

20 Claims, 9 Drawing Sheets

(51) Int. Cl.
*H01L 25/07* (2006.01)
*H01L 23/00* (2006.01)
*H01L 21/56* (2006.01)

(52) U.S. Cl.
CPC .. *H01L 23/49524* (2013.01); *H01L 23/49541* (2013.01); *H01L 23/49551* (2013.01); *H01L 23/49562* (2013.01); *H01L 23/49575* (2013.01); *H01L 24/00* (2013.01); *H01L 25/072* (2013.01); H01L 21/561 (2013.01); H01L 23/3107 (2013.01); H01L 23/49568 (2013.01); H01L 24/48 (2013.01); H01L 2224/48091 (2013.01); H01L 2224/48106 (2013.01); H01L 2224/48247 (2013.01); H01L 2924/00014 (2013.01); H01L 2924/181 (2013.01)

(56) References Cited

U.S. PATENT DOCUMENTS

| | | | |
|---|---|---|---|
| 2004/0056363 A1* | 3/2004 | Wada | H01L 21/565 257/777 |
| 2008/0061408 A1* | 3/2008 | Li | H01L 23/49541 257/666 |
| 2013/0062745 A1* | 3/2013 | Kimura | H01L 23/4334 257/675 |
| 2016/0233149 A1 | 8/2016 | Murugan et al. | |

FOREIGN PATENT DOCUMENTS

| | | |
|---|---|---|
| DE | 102013102973 A1 | 10/2013 |
| EP | 0696818 A2 | 2/1996 |
| WO | 9620502 A1 | 7/1996 |

* cited by examiner

SEMICONDUCTOR CHIP PACKAGE HAVING A REPEATING FOOTPRINT PATTERN

TECHNICAL FIELD

This disclosure relates generally to the technique of semiconductor device packaging, and in particular to aspects of a semiconductor chip package which offer users wide application variability.

BACKGROUND

Semiconductor device manufacturers are constantly striving to increase the performance of their products, while decreasing their cost of manufacture. A cost intensive area in the manufacture of semiconductor device packages is packaging the semiconductor chip. Thus, semiconductor device packages and methods of manufacturing the same at low expenses and high yield are desirable. In particular, the performance of power semiconductor device packages is dependent from the heat dissipation capability provided by the package. Geometry of the package in terms of package layout, footprint, distribution of terminal etc. may strongly affect the performance of the package. Packaging concepts of power devices providing high thermal robustness at low expenses and increased user benefits in view of application variability are desirable.

SUMMARY

An aspect of the disclosure relates to a semiconductor chip package. The semiconductor chip package includes a carrier and a semiconductor chip disposed over a first main surface of the carrier. The semiconductor chip package further includes an encapsulation body encapsulating the semiconductor chip. The encapsulation body has a first main face, a second main face opposite the first main face and a plurality of side faces. First electrical contact elements, which are electrically coupled to the semiconductor chip, protrude out of the encapsulation body through a first side face of the encapsulation body. Second electrical contact elements, which are electrically coupled to the semiconductor chip, protrude out of the encapsulation body through a second side face of the encapsulation body opposite the first side face. A first group of the first electrical contact elements and a second group of the first electrical contact elements are spaced apart by a distance D that is greater than a distance P between adjacent first electrical contact elements of the first group and between adjacent first electrical contact elements of the second group. The distances D and P are measured between center axes of electrical contact elements. Further, a second main surface of the carrier opposite the first main surface of the carrier is at least partially exposed from the encapsulation body.

Another aspect of the disclosure relates to a semiconductor chip package including at least two semiconductor chips. More specifically, the semiconductor chip package includes a carrier, a first semiconductor chip and a second semiconductor chip disposed over a first main surface of the carrier. The semiconductor chip package further includes an encapsulation body encapsulating the first semiconductor chip and the second semiconductor chip. The encapsulation body has a first main face, a second main face opposite the first main face and a plurality of side faces. First electrical contact elements, which are each electrically coupled to at least one the first semiconductor chip and the second semiconductor chip, protrude out of the encapsulation body through a first side face of the encapsulation body. Second electrical contact elements, which are each electrically coupled to at least one of the first semiconductor chip and the second semiconductor chip, protrude out of the encapsulation body through a second side face of the encapsulation body opposite the first side face. A first group of the first electrical contact elements and a second group of the first electrical contact elements are spaced apart by a distance D that is greater than a distance P between adjacent first electrical contact elements of the first group and between adjacent first electrical contact elements of the second group. The distances D and P are measured between center axes of electrical contact elements. Further, a second main surface of the carrier opposite the first main surface of the carrier is at least partially exposed from the encapsulation body.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts. It is to be understood that the features of the various examples of embodiments described below may be combined with each other, unless specifically noted otherwise.

DETAILED DESCRIPTION

Figure 1A:
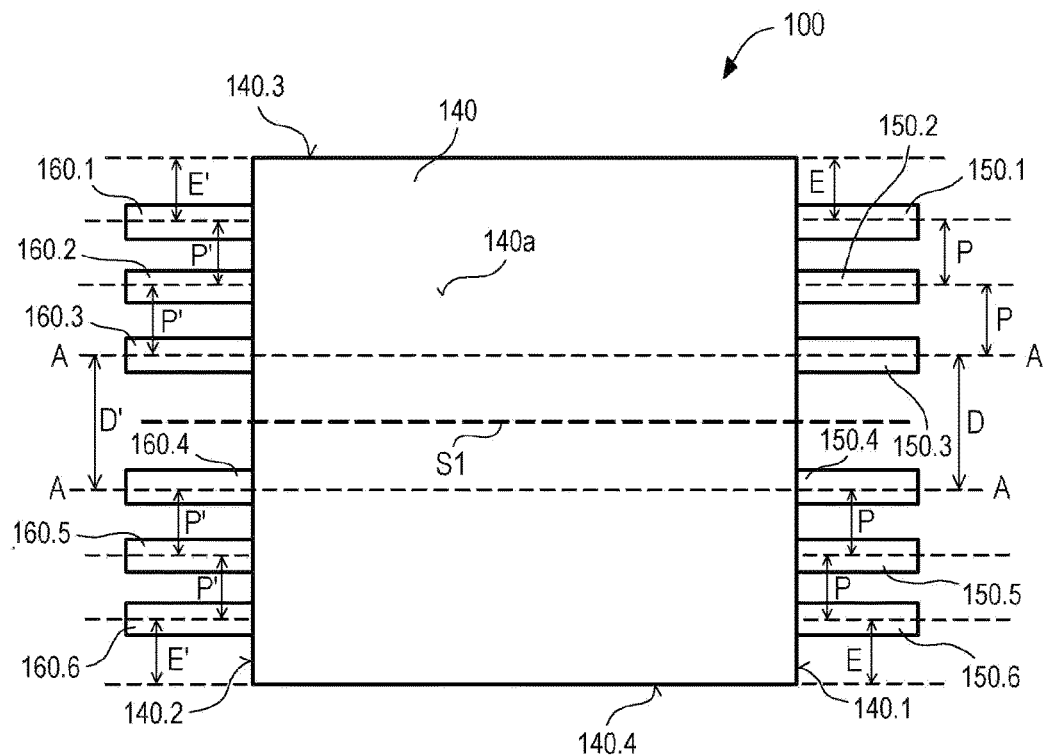
FIG. 1A is a bottom view (footprint) of an example of a semiconductor chip package 100 in accordance with the disclosure.

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

Further, the words "perpendicular" and "parallel" may be used herein with regard to a relative orientation of two or more components. It is understood that these terms may not necessarily mean that the specified geometric relation is realized in a perfect geometric sense. Instead, fabrication tolerances of the involved components may need to be considered in this regard. For example, if two surfaces of an encapsulation material of a semiconductor package are specified to be perpendicular (or parallel) to each other, an actual angle between these surfaces may deviate from an exact value of 90 (or 0) degrees by a deviation value that may particularly depend on tolerances that may typically occur when applying techniques for fabricating a housing made of the encapsulation material.

Semiconductor chip packages containing one or more semiconductor chips are, inter alia, described herein. In particular, one or more power semiconductor chips may be involved. Power semiconductor chips may, for example, be configured as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., PIN diodes or Schottky diodes.

The semiconductor chip packages described herein may include one or more logic integrated circuits to control the power semiconductor chip(s). The logic integrated circuit may include one or more driver circuits to drive one or more of the power semiconductor chips. The logic integrated circuit may, e.g., be a microcontroller including, e.g., memory circuits, level shifters, etc.

Power semiconductor chip(s) may, e.g., have a vertical structure, that is to say that the semiconductor chip(s) may be fabricated in such a way that electric currents can flow in a direction perpendicular to the main surfaces of the semiconductor chip(s). A semiconductor chip having a vertical structure has electrodes on its two main surfaces, that is to say on its top side and bottom side. By way of example, in vertical devices, the source contact electrode and the gate contact electrode of a power MISFET or a power MOSFET or a power JFET or a HEMT may be situated on one main surface, while the drain contact electrode of the power MISFET or power MOSFET or power JEFT or power HEMT may be arranged on the other main surface. Analogously, in bipolar transistor vertical devices, the emitter contact electrode and the gate contact electrode of a power JGBT may be situated on one main surface, while the collector contact electrode of the power JGBT may be arranged on the other main surface. In case of a power diode, the anode contact electrode may be situated on one main surface, while the cathode contact electrode of the power diode may be arranged on the other main surface.

Semiconductor chip packages containing semiconductor chip(s) having a horizontal structure may be involved. A semiconductor chip having a horizontal structure has chip electrodes only on one of its two main surfaces, e.g. on its active surface. Logic integrated circuit chips as well as power semiconductor chips (e.g. power MISFETs or power MOSFETs or power JFETs power HEMTs) may have a horizontal structure.

The semiconductor chips may be manufactured from specific semiconductor material such as, for example, Si, SiC, SiGe, GaAs, GaN, etc., and, furthermore, may contain inorganic and/or organic materials that are not semiconductors. The semiconductor chips may be of different types and may be manufactured by different technologies.

The semiconductor chips may have electrodes (chip pads) which allow electrical contact to be made with the integrated circuits included in the semiconductor chips. The electrodes may include one or more metal layers which are applied to the semiconductor material of the semiconductor chips. The metal layers may be manufactured with any desired geometric shape and any desired material composition. The metal layers may, for example, be in the form of a layer or land covering an area. By way of example, any desired metal capable of forming a solder bond or a diffusion solder bond, for example Cu, Ni, NiSn, Au, Ag, Pt, Pd, In, Sn, and an alloy of one or more of these metals may be used as the material. The metal layers need not be homogenous or manufactured from just one material, that is to say various compositions and concentrations of the materials contained in the metal layers are possible.

The semiconductor chip packages described herein include a carrier and at least one semiconductor chip disposed over and/or mounted on the carrier. In one or more embodiments, the carrier may comprise one or more die pads of, e.g., a leadframe. Each die pad may serve as a chip carrier. The semiconductor chip packages described herein further include electrical contact elements electrically coupled to the semiconductor chip(s). The electrical contact elements may comprise one or more leads of, e.g., the leadframe. The leads may protrude out of an encapsulation body and may form external terminals of the semiconductor chip package. That is, one or more embodiments of the semiconductor chip package described herein may comprise a leaded chip carrier (LCC), in particular a leadframe, configured for surface mount technology (SMT).

The chip carrier and the one or more semiconductor chips may at least partly be surrounded or embedded in at least one encapsulating material forming an encapsulation body. The encapsulating material may be an electrically insulating material and may comprise or be a thermoset material or a thermoplastic material. A thermoset material may, e.g., be made on the basis of an epoxy resin, a silicone resin or an acrylic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The encapsulating material may comprise or be a polymer material, e.g. a duroplastic polymer material. The encapsulating material may comprise or be at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

The encapsulating material may be applied over the one or more semiconductor chips and, e.g., the carrier by, e.g., molding or laminating.

In the first case, i.e. if the encapsulating material is a mold material, various techniques such as, e.g., compression molding, injection molding, powder molding, liquid molding, or film-assisted molding (FAM) may be used to form the encapsulation body. The mold material may be applied to overmold the semiconductor chips and the carrier(s) on which the semiconductor chip(s) may be mounted. At least a part of a surface of the carrier facing away from the semiconductor chip may remain exposed from the encapsulation body and may serve as an interface for heat removal.

In the second case, i.e. if the encapsulating material is made of a laminate material, the encapsulating material may have the shape of a piece of a layer, e.g. a piece of a sheet or foil that is laminated over the semiconductor chips and over the chip carrier on which the semiconductor chips are mounted. Heat and pressure may be applied for a time suitable to attach the piece of a foil or sheet to the underlying structure. During lamination, the electrically insulating foil or sheet is capable of flowing (i.e. is in a plastic state), resulting in that gaps between the semiconductor chip(s) and/or other topological structures are filled with the polymer material of the electrically insulating foil or sheet. The electrically insulating foil or sheet may comprise or be of any appropriate thermoplastic or thermoset material. In various embodiments, the insulating foil or sheet may comprise or be a prepreg (short for pre-impregnated fibers), that is e.g. made of a combination of a fiber mat, for example glass or carbon fibers, and a resin, for example a thermoset or thermoplastic material. Prepreg materials are typically used to manufacture PCBs (printed circuit boards). Again, also for laminate packages, at least a part of a surface of the carrier facing away from the semiconductor chip may remain exposed from the encapsulation body and may serve as an interface for heat removal.

One or more semiconductor power devices may be monolithically integrated in each semiconductor chip. One semiconductor power device may, e.g., be one transistor, e.g. one transistor of any of the types described above.

A semiconductor chip package as disclosed herein may comprise a half-bridge circuit including one or more high side transistor(s), one or more low side transistor(s) and, optionally, a logic integrated circuitry. The logic integrated circuitry may, optionally, include one or a plurality of transistor driver circuitry.

A half-bridge circuit as disclosed herein may, e.g., be implemented in an electronic circuit for converting DC or AC voltages into DC voltages, so-called DC-DC converters and AC-DC converters, respectively. DC-DC converters may be used to convert a DC input voltage provided by a battery or rechargeable battery into a DC output voltage matched to the demands of electronic circuits connected downstream. By way of example, a DC-DC converter described herein may be a buck converter or down-converter. AC-DC converters may be used to convert an AC input voltage provided by, e.g., a high voltage AC power network into a DC output voltage matched to the demands of electronic circuits connected downstream.

Figure 1B:
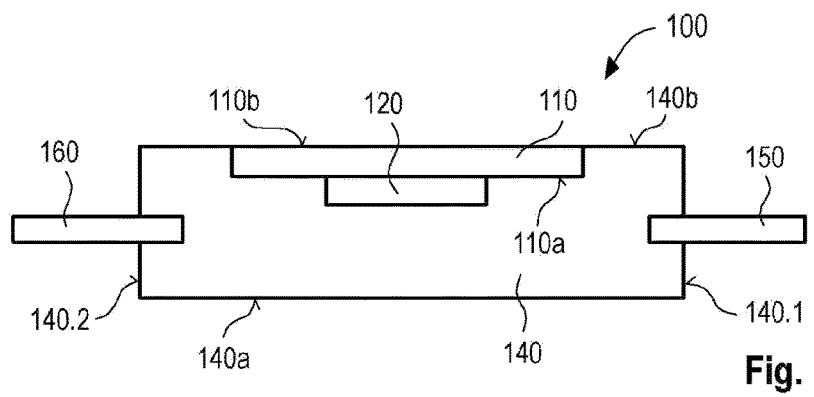
FIG. 1B is a cross-sectional view of the semiconductor chip package 100 along line A-A in FIG. 1A.

FIGS. 1A and 1B illustrate an example of a semiconductor chip package 100. The semiconductor chip package 100 may include a carrier 110. The carrier 110 has a first main surface 110a and a second main surface 110b opposite the first main surface 110a. A semiconductor chip 120 is arranged over the first main surface 110a of the carrier 110. For example, the carrier 110 may be a die pad of a leadframe and the semiconductor chip 120 may be a power semiconductor chip.

The semiconductor chip package 100 may further include an encapsulation body 140. The encapsulation body 140 may include a first main face 140a, a second main face 140b and at least four side faces 140.1, 140.2, 140.3 and 140.4. For example, the first and second main faces 140a, 140b and the side faces 140.1, 140.2, 140.3 and 140.4 may be arranged such that the encapsulation body 140 has the form of a rectangular cuboid.

The encapsulation body 140 may encapsulate partly or completely the semiconductor chip 120. In addition, the encapsulation body 140 may at least partly cover the carrier 110. By way of example, the encapsulation body 140 may partly or completely cover the first main surface 110a of the carrier 110 and may cover partly or completely the side faces of the carrier 110. The second main surface 110b of the carrier 110 may, however, remain partly or completely uncovered by the encapsulation body 140. That is, the second main surface 110b of the carrier 110 opposite the first main surface 110a on which the semiconductor chip 120 is mounted may be partly or fully exposed from the encapsulation body 140.

The semiconductor chip package 100 may further include first electrical contact elements 150 and second electrical contact elements 160. The first electrical contact elements 150 are electrically coupled to the semiconductor chip 120 (coupling is not shown in FIG. 1A) and protrude out of the encapsulation body 140 through the first side face 140.1 of the encapsulation body 140. Similarly, the second electrical contact elements 160 are coupled to the semiconductor chip 120 (coupling is not shown in FIG. 1A) and protrude out of the encapsulation body 140 through the second side face 140.2 of the encapsulation body 140 opposite the first side face 140.1. It is to be noted that the third side face 140.3 and the fourth side face 140.4 of the encapsulation body 140 may be void of any electrical contact elements.

The second main surface 110b of the carrier 110 and the second main face 140b of the encapsulation body 140 may be arranged in a common plane. The first electrical contact elements 150 and the second electrical contact elements 160 may protrude out of the encapsulation body 140 in a plane that is parallel to and spaced apart from the common plane.

As depicted in FIG. 1A, the first electrical contact elements 150 comprises a first group of first electrical contact elements 150.1, 150.2, 150.3 and a second group of the first electrical contact elements 150.4, 150.5, 150.6. A distance between adjacent first electrical contact elements 150.1, 150.2, 150.3 of the first group is P, and the adjacent first electrical contact elements 150.4, 150.5, 150.6 of the second group of the first electrical contact elements 150 may be spaced apart from each other by the same distance P.

The first group of the first electrical contact elements 150.1, 150.2, 150.3 is spaced apart by a distance D from the first electrical contact elements 150.4, 150.5, 150.6 of the second group of the first electrical contact elements 150. The distance D is a greater than the distance P. As illustrated in FIG. 1A, the distances D and P are measured between center axes of the first electrical contact elements 150.

The second electrical contact elements 160 may be arranged in a similar fashion as the first electrical contact elements 150. In order to avoid reiteration, reference is made to the description above, which may analogously be applied to the second electrical contact elements 160 arranged at the second side face 140.2. That is, a first group of second electrical contact elements 160.1, 160.2, 160.3 may be spaced apart from a second group of second electrical contact elements 160.4, 160.5, 160.6 by a distance D', wherein a distance between adjacent second electrical contact elements 160.1, 160.2, 160.3 and 160.4, 160.5, 160.6 in each group may be P'. D' may be equal to or greater than P'. That is, in contrast to the first electrical contact elements 150, where D is always greater than P, the second electrical contact elements 160 may optionally all be arranged under an equal distance P' (which is then equal to D') from each other.

Generally, D' may be equal to or different from P', P may be equal to or different from P', and the number of first electrical contact elements 150 of the first group and/or the second group may be equal to or different from the number of second electrical contact elements 160 of the first group and/or of the second group, respectively. However, in various embodiments, P is equal to P' and/or D is equal to D' and/or the numbers of first and second electrical contact elements 150, 160 are equal.

S1 represents a symmetry line of the semiconductor chip package footprint as illustrated in FIG. 1A. As the semiconductor chip package 100 may, e.g., be a surface mounting device (SMD), S1 may represent a symmetry line of an SMD footprint. The symmetry line S1 extends perpendicular to the first side face 140.1 and perpendicular to the second side face 140.2. The symmetry line S1 intersects the first side face 140.1 and the second side face 140.2 in the middle of each of their longitudinal dimensions (which are typically of equal length), that is in the middle of the distance D and in the middle of the distance D', respectively. The footprint of the semiconductor chip package 100 is defined by the outline of the semiconductor chip package 100 represented by the side faces 140.1 to 140.4 and by the outlines of the first and second electrical contact elements 150 and 160, respectively.

The distance D may be an integer multiple of the distance P. Further, the distance D/2 may be equal to a distance E as measured between the laterally outermost first electrical contact element 150.1 and the third main face 140.3 (i.e. from a corner) of the encapsulation body 140. Further, the opposite outermost first electrical contact element 150.6 may be spaced apart from the fourth side face 140.4 (i.e. from the opposite corner) of the encapsulation body 140 by the same distance E.

Analogously, the same dimensional relationship may optionally apply for the second electrical contact elements 160 at the second side face 140.2 of the encapsulation body 140. That is, D'/2 may be equal to E' as measured both between the second electrical contact element 160.1 and the third main face 140.3 and between the second electrical contact element 160.6 and the fourth main face 140.4, as illustrated in FIG. 1A.

As a consequence of the symmetry line S1, the semiconductor chip package 100 has a "self-similar" feature in terms of a recurring (repeating) footprint pattern. That is, an upper portion of the footprint which comprises the third side face 140.3, the first electrical contact elements 150.1, 150.2, 150.3 and the second electrical contact elements 160.1, 160.2, 160.3 is replicated by a lower footprint portion (below symmetry line S1) that comprises the fourth side face 140.4, the first electrical contact elements 150.4, 150.5, 150.6 and the second electrical contact elements 160.4, 160.5, 160.6. In other words, each of the above-mentioned footprint portions may be viewed as an elementary footprint entity which is replicated to form a "scaled-up" semiconductor chip package 100 according to embodiments described herein.

It is to be noted that this concept of an elementary footprint entity or pattern which, by replication, establishes larger footprint structures of semiconductor chip packages as described herein, may be extended to N replications, where N is equal to or greater than two. For example, if N is three, the fourth side face 140.4 would represent another symmetry line similar to symmetry line S1, and another footprint portion with equal dimensional specifications as the lower footprint portion would continue the package at this symmetry line to form a package having three recurring elementary footprint portions (see also FIGS. 10A, 10B, 11 as explained further below). In other words, though the example of FIG. 1A uses N=2, more extended packages with N>2 are feasible.

There are a number of benefits of a package design concept as explained above: First, application board designer such as, e.g., PCB designer can use the elementary footprint portion as a built-up pattern for board layout. That is, the PCB designer may rely on the universal periodicity of the footprint pattern given, e.g., by the distance P and/or the distance D. In many application cases, a number of semiconductor chip packages are to be mounted side-by-side on a PCB. Then, as the elementary footprint portion is replicated if the number of packages to be arranged side-by-side on the PCB is increased, the PCB designer can use a predetermined footprint pattern before deciding, e.g., on the number and sizes of the semiconductor chip packages to be mounted on the PCB. In this context, size of a semiconductor chip package simply means the number N of elementary footprint portions included in that package.

More generally, the recurring elementary footprint portion may establish a design standard or design rule for PCB layout. This design rule may at least be applicable for PCB regions designated to semiconductor chip packages of a specific electrical functionality, e.g. for power switches. Such design standard or design rule may greatly facilitate PCB circuit layout at the customer's site.

Second, the use of a recurring elementary footprint pattern (of which at least two such patterns are assembled in one semiconductor chip package) may provide substantial costs savings at the semiconductor chip package manufacturer's site. Many semiconductor chip packages are manufactured on the basis of a leadframe. Before separation into individual semiconductor chip packages, such leadframe typically contains recurring leadframe patterns, wherein each leadframe pattern comprises one or more die pads surrounded by an array of leads. According to embodiments described herein, the leads of the leadframe are exclusively arranged along the longitudinal sides of the leadframe. This and the concept of an elementary recurring footprint pattern in the longitudinal dimension allow to fabricate semiconductor chip packages of various sizes (i.e. semiconductor chip packages including a variable number of elementary footprint portions and/or groups of first and/or second electrical terminals) with virtually the same manufacturing equipment. The semiconductor package size may simply be scaled-up to larger package sizes by applying one encapsulation body to more than one leadframe pattern, e.g. to 2, 3, . . . consecutive leadframe patterns. Each leadframe pattern enclosed that way in one encapsulation body then translates into one elementary footprint portion and/or one group of first and/or second electrical terminals as illustrated above. By using this concept, only minor constructional adaptions are needed to modify or retool the manufacturing equipment when changing the production from one package size to another package size. In particular, the dimensions P, P' and/or D, D' and/or E, E' may remain unchanged irrespective of the size of the package (e.g. in terms of the footprint pattern replication number N) to be manufactured.

Figure 2:
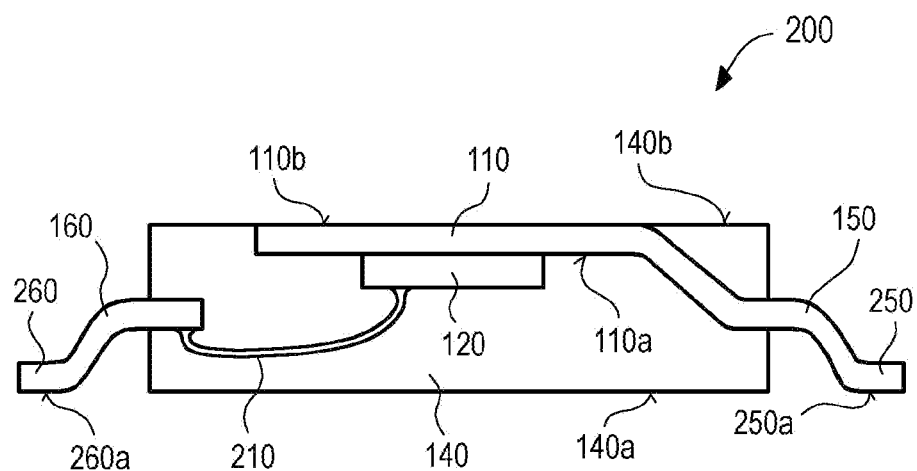
FIG. 2 is a cross-sectional view of an example of a semiconductor chip package 200 along line A-A.

FIG. 2 schematically illustrates a cross sectional side view of an exemplary semiconductor chip package 200. The semiconductor chip package 200 may be understood as a more detailed illustration of semiconductor chip package 100, and therefore, description of elements corresponding to those shown in FIGS. 1A and 1B are omitted for the sake of brevity.

As illustrated in FIG. 2, the first main face 140a may be the bottom face of the semiconductor chip package 200 and the second main face 140b may be the top face of the semiconductor chip package 200. The first and second electrical contact elements 150, 160 are bent down in the direction to the first main face 140a. More specifically, the first electrical contact elements 150 may comprise bonding portions 250 having a bonding surface 250a and the second electrical contact elements 160 may comprise bonding portions 260 having a bonding surface 260a. The bonding surfaces 250a, 260a and the first main face 140a of the encapsulation body 140 may be arranged in a substantial common plane. In this case, the first main face 140a is designated to face an application board on which to the semiconductor chip package 200 is to be mounted.

The first electrical contact elements 150 are, e.g., integral with the carrier 110, which is, e.g., a die pad of a leadframe. The semiconductor chip 120 may be a power semiconductor chip with, e.g., a load electrode (e.g. drain or collector electrode) mounted on and electrically connected to the carrier 110.

The second electrical contact elements 160 may, e.g., be separated from the carrier 110. They may be connected to the semiconductor chip 120 by wire bonds 210 or other electrical connection means. As will be described further below, connections may be made between one or more second electrical contact elements 160 and, e.g., a load electrode (e.g. source or emitter electrode) of the semiconductor chip 120 and between one or more second electrical contact elements 160 and, e.g., a control electrode (e.g. gate or base electrode) of the semiconductor chip 120. Likewise, throughout the entire description, it is possible that the second electrical contact elements 160 are integral with the carrier 110 while the first electrical contact elements 150 are separated from the carrier (in this case, the first electrical contact elements are exemplified by contact elements 160 while the second electrical contact elements are exemplified by contact elements 150).

Figure 3:
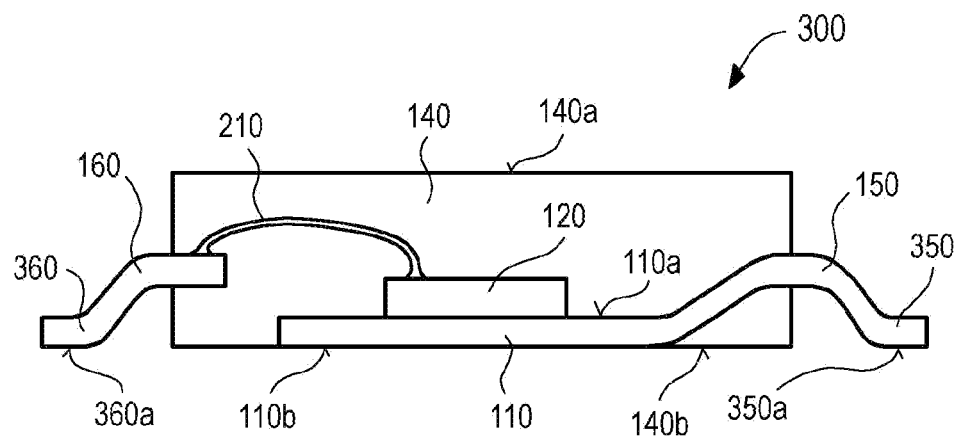
FIG. 3 is a cross-sectional view of an example of a semiconductor chip package 300 along line A-A.

FIG. 3 schematically illustrates a cross-sectional side view of an example of a semiconductor chip package 300. In the semiconductor chip package 300, the first main face 140a is the top face of the semiconductor chip package 300 and the second main face 140b is the bottom face of the semiconductor chip package 300. That is, the first electrical contact elements 150 are bent down in the direction of the second main face 140b to have a bonding portion 350 with a bonding surface 350a which may, e.g., be essentially coplanar with the second main face 140b, and the second electrical contact elements 160 are bent down in the direction to the second main face 140b to have a bonding portion 360 with a bonding surface 360a which, e.g., may be substantially coplanar with the second main face 140b of the encapsulation body 140.

A further difference between the semiconductor chip package 200 and the semiconductor chip package 300 is that in semiconductor chip package 200, the heat is removed at a package surface opposite to the mounting surface (i.e. the first main face 140a) of the package while in semiconductor chip package 300, the heat is removed at the mounting surface (i.e. the second main face 140b) of the semiconductor chip package 300. In both cases, a heat sink (not shown) may be provided and configured to mechanically connect to the exposed surface 110b of the carrier 110.

The residual features of semiconductor chip package 300 may be similar or identical to the corresponding features of the semiconductor chip packages 100, 200, and reiteration is avoided for the sake of brevity.

Figure 4A:
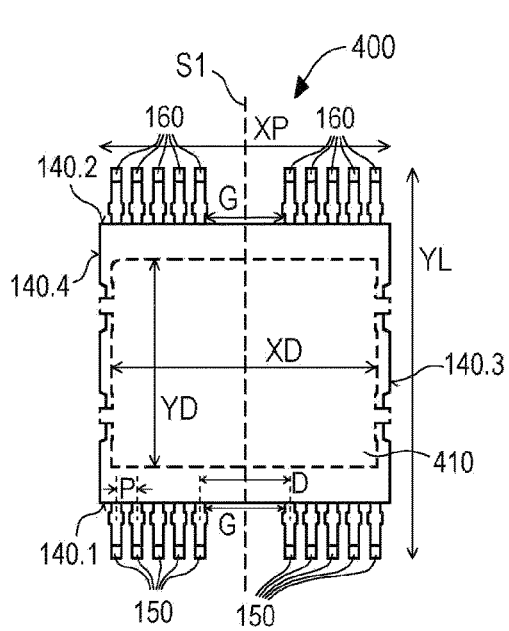
FIG. 4A is a bottom view (footprint) of an example of a semiconductor chip package 400, wherein the contour of a die pad is indicated by dashed lines.

FIG. 4A illustrates the footprint of a semiconductor chip package 400. Semiconductor chip package 400 may be identical to the semiconductor chip package 100 with the exception that semiconductor chip package 100 illustrates an example in which each group of the first electrical contact elements 150 and each group of the second electrical contact elements 160 includes three contact elements while in semiconductor chip package 400, each of these groups of electrical contact elements are exemplified to include five electrical contact elements. However, the number of first and/or second electrical contact elements 150 and 160, respectively, in each group may vary and is not restricted to the number of electrical contact elements of any of the examples illustrated herein.

The residual features of semiconductor chip package 400 may be similar or identical to the corresponding features of the semiconductor chip packages 100, 200, 300, and reiteration is avoided for the sake of brevity.

A dimension of the footprint of the semiconductor chip package 400 in longitudinal direction X is given by the package dimension of, e.g., XP=16 mm. A dimension YL of the footprint of the semiconductor chip package 400 in transversal direction Y may be defined by the extension of the leadframe as measured from the end of the first electrical contact elements 150 to the end of the second electrical contact elements 160, with e.g. YL=20.96 mm. A gap of dimension G with e.g. G=4.34 mm may be provided between neighboring first electrical contact elements 150 of the first and group and the second group, and the same gap G may be provided between neighboring second electrical contact elements 160 of the first group and the second group. It is to be noted that D is equal to G plus the thickness of one first or second electrical contact element 150, 160, since G is not measured between the axis of the electrical contact elements but between their opposing edges. All the above figures are mere examples, and the dimensions XP, YL, G and D can be equal to or greater than or smaller than these figures, which themselves may vary by, e.g., plus/minus 80%, 50%, 30%, or 10%.

FIG. 4A further illustrates the contour of a die pad 410. In this example, the die pad 410 corresponds to the carrier 110. The contour of the die pad 410 is indicated by dashed lines. The die pad 410 may have a length of, e.g., XD=14.0 mm (or in another example 12.1 mm) in the X direction and may have a transversal dimension of, e.g., YD=10.6 mm (or in the other example 10.7 mm) in the Y direction. Again, these figures are mere examples, and the die pad dimensions XD, YD can be equal to or greater than or smaller than these figures, which themselves may vary by, e.g., plus/minus 80%, 50%, 30%, or 10%. That is, the die pad 410 may have an area size of 148 mm$^2$ (or in the other example 129 mm$^2$), with a variation of, e.g., ±20%).

Figure 4B:
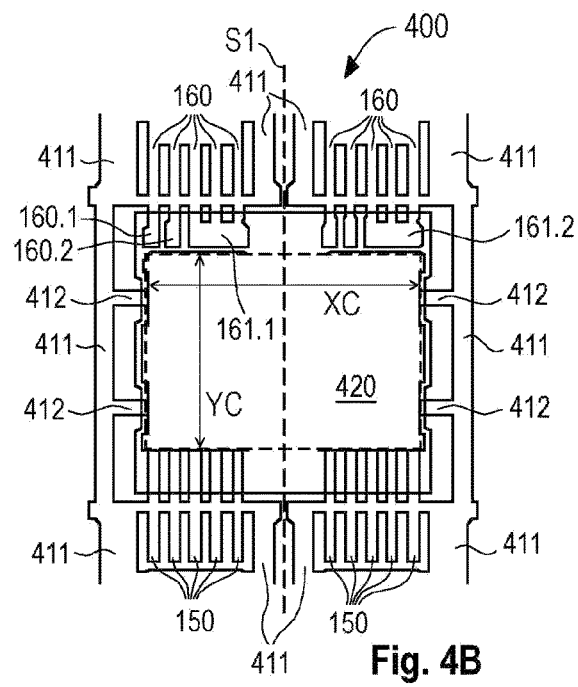
FIG. 4B is a top view of the semiconductor chip package 400 during a stage of manufacture after bonding the semiconductor chip onto the die pad of a leadframe and before encapsulating and separating the leadframe.

In FIG. 4A, there is only one continuous die pad 410 included in the semiconductor chip package 400. FIG. 4B is a top view of the semiconductor chip package 400 during a stage of manufacturing at which a semiconductor chip 420 (corresponding to semiconductor chip 120) is already mounted on the die pad 410 but before the encapsulation body is applied and the leadframe is separated. As such, the frame 411 of the leadframe and ridges (tiebars) 412 of the leadframe that hold the die pad 410 in place are still present. The leadframe may be designed as a continuous strip having a recurring structure as shown in FIG. 4B in the longitudinal X direction.

FIG. 4B further illustrates that only one single semiconductor chip 410 may be mounted on the one die pad 410. The single semiconductor chip 420 may have a length of, e.g., XC=14.0 mm in the X direction and may have a transversal dimension of, e.g., YC=10.7 mm in the Y direction. Thus, the semiconductor chip 420 may, e.g., completely overlay the die pad 410. These figures are mere examples, and the semiconductor chip dimensions XC, YC can be equal to or greater than or smaller than these figures, which themselves may vary by, e.g., plus/minus 80%, 50%, 30%, or 10%.

The semiconductor chip 420 may, e.g., comprise two semiconductor power devices, which are both monolithically integrated in the semiconductor chip 420. A first semiconductor power device may be associated with the first group of first and second electrical contact elements 150, 160 (which is the group of contact elements 150, 160 depicted on the left side in FIG. 4B), and the second semiconductor power device may be associated with the second group of first and second electrical contact elements 150, 160 (which is the group of contact elements 150, 160 depicted on the right side in FIG. 4B). More specifically, as illustrated in FIG. 4B, the first group of contact elements 150, 160 (leads) may, e.g., comprise 5 contact elements 150 which are all integral with the die pad 410, and may comprise 5 contact elements 160, wherein, e.g., 3 of these 5 contact elements 160 combine to a common terminal land 161.1 which is separated from the residual 2 contact elements 160.1, 160.2. Further, the common terminal land 161.1 and the residual 2 contact elements 160.1, 160.2 are separated from the die pad 410. Similarly, the second group of contact elements 150, 160 (leads) may, e.g., comprise 5 contact elements 150 which are all integral with the die pad 410, and may comprise 5 contact elements 160, wherein, e.g., 3 of these 5 contact elements 160 combine to a common terminal land 161.2 which is separated from the residual 2 contact elements 160.1, 160.2. Further, the common terminal land 161.2 and the residual 2 contact elements 160.1, 160.2 are separated from the die pad 410.

The first and second semiconductor power devices may be power switches (e.g. power transistors). In this case, the 5 contact elements 150 of each group which are all integral with the die pad 410 may connect to the drain electrode or collector electrode of the power transistor. The 3 contact elements 160 of each group which combine to the terminal land 161.1 (for the first group) or to the terminal land 161.2 (for the second group) may connect to the source electrode or emitter electrode of the power transistor. Contact element 160.1 of the residual 2 contact elements 160.1, 160.2 may, e.g., connect to the gate or base electrode of the power transistor, and contact element 160.2 may, e.g., be a sense terminal connected to the source or emitter electrode of the power transistor. Adequate wiring which forms these electrical connections is neither shown in FIG. 4B nor in upcoming FIGS. 5B, 6B and 7B, but in FIGS. 8B, 9, 10B, and 11.

It is to be noted that the first and second semiconductor power devices may be of equal or different functionality. If they are of equal functionality, e.g. both are power switches (e.g. power transistors), the symmetry line S1 also represents a symmetry line in view of package functionality. That is, the concept of a recurring elementary footprint pattern in terms of footprint geometry then also translates into the functional level of the package.

Figure 5A:
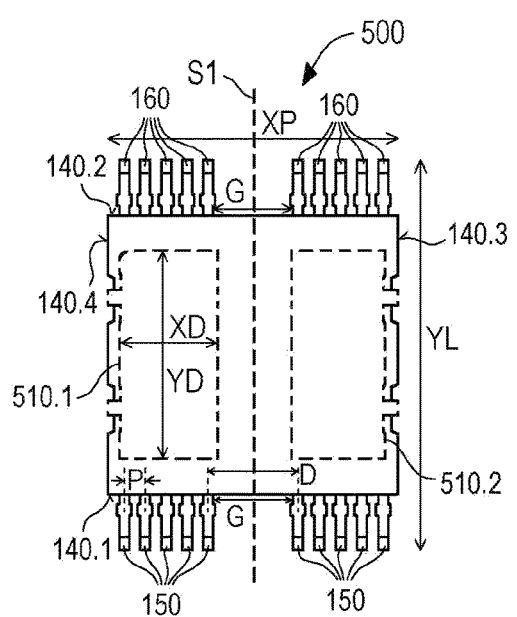
FIG. 5A is a bottom view (footprint) of an example of a semiconductor chip package 500, wherein the contours of two die pads each aligned in parallel to the direction of the electric contact elements are indicated by dashed lines.

FIG. 5A illustrates a footprint of a semiconductor chip package 500. The semiconductor chip package 500 may be identical to the semiconductor chip package 400 except that the package 500 includes two separate die pads 510.1, 510.2 instead of one die pad 410 as exemplified in FIG. 4A. The symmetry line S1 represents a symmetry line in view of the footprint geometry and also in view of the die pads 510.1, 510.2 and further, e.g., in view of the entire leadframe geometry.

Each of the two die pads 510.1, 510.2 may have a length XD=5.0 mm in X direction and may have a transversal dimension of YD=10.6 mm in Y direction. These figures are mere examples, and the die pad dimensions XD, YD can be equal to or greater than or smaller than these figures, which themselves may vary by, e.g., plus/minus 80%, 50%, 30%, or 10%.

Figure 5B:
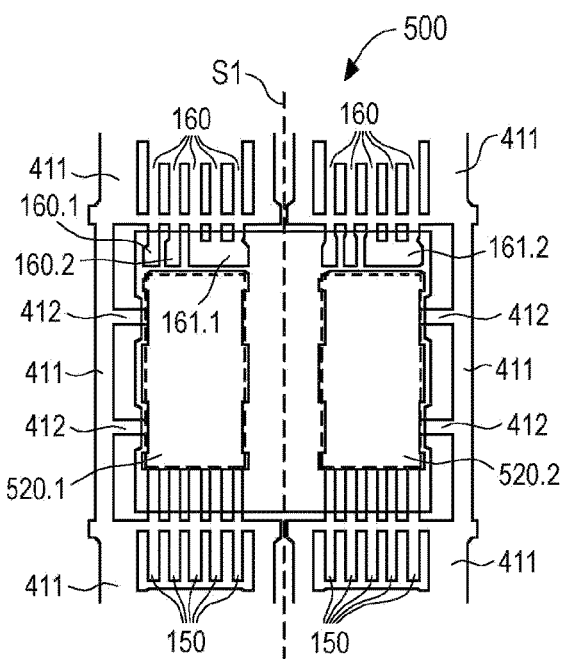
FIG. 5B is a top view of the semiconductor chip package 500 during a stage of manufacture after bonding the semiconductor chips onto the die pad of a leadframe and before encapsulating and separating the leadframe.

FIG. 5B is a top view of the semiconductor chip package 500 similar to the view of FIG. 4A. As apparent in FIG. 5B, two semiconductor chips 520.1, 520.2 are included in the package 500. The first semiconductor chip 520.1 is mounted on and may, e.g., completely overlay the first die pad 510.1 and the second semiconductor chip 520.2 is mounted on and may, e.g., completely overlay the second die pad 510.2. The first semiconductor chip 520.1 and the second semiconductor chip 520.2 are arranged side-by-side with respect to direction X which corresponds to the direction of the first side face 140.1 and the second side face 140.2 of the encapsulation body 140.

The first semiconductor chip 520.1 and the second semiconductor chip 520.2 may each implement one semiconductor device, which may be monolithically integrated in each of the semiconductor chips 520.1 and 520.2, respectively. These two semiconductor devices may have the same or different electrical functionalities. If their functionalities are the same, the symmetry line S1 represents a symmetry line in view of footprint geometry, in view of the die pads 510.1, 510.2, e.g. in view of the leadframe geometry and in view of functionality.

Figure 6:
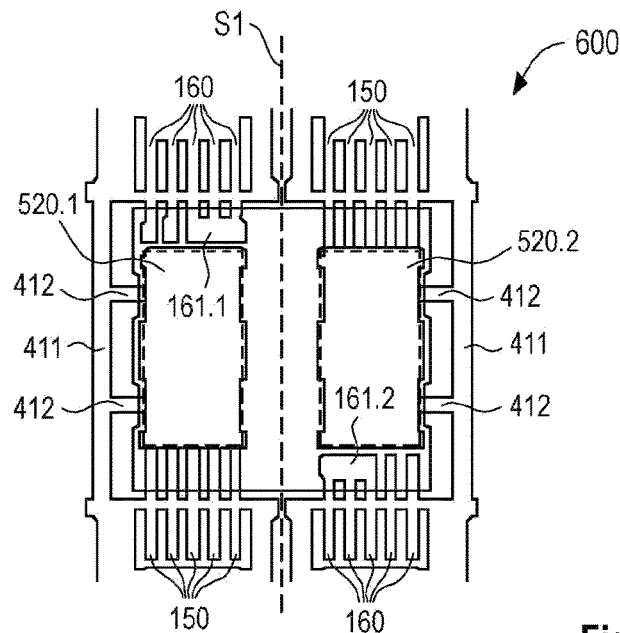
FIG. 6 is a top view of an example of a semiconductor chip package 600 during a stage of manufacture after bonding the semiconductor chips onto the die pad of a leadframe and before encapsulating and separating the leadframe.

FIG. 6 illustrates a top view of a semiconductor chip package 600. The semiconductor chip package 600 is identical to the semiconductor chip package 500 with the exception that the second semiconductor chip 520.2 is rotated by 180°. As a consequence, the terminal portions (e.g. terminal land 161.2 etc.) of the contact elements 150, 160 of the second group are rotated by 180°. The symmetry line S1 is no longer a leadframe symmetry line. It may or may not stay a symmetry line in view of functionality.

Figure 7A:
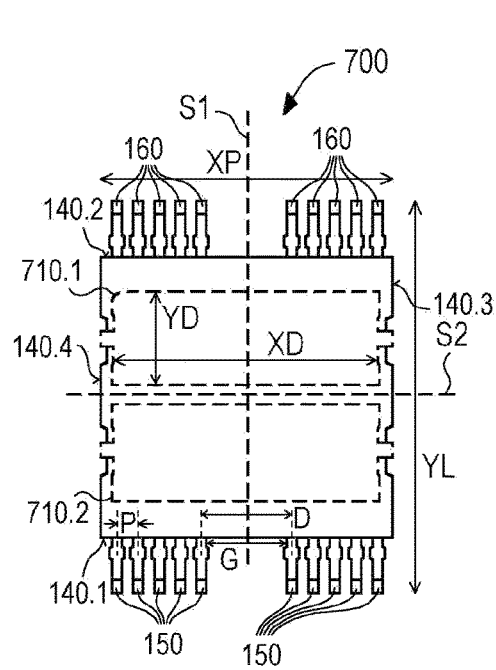
FIG. 7A is a bottom view (footprint) of an example of a semiconductor chip package 700, wherein the contours of two die pads each aligned perpendicular to the direction of the electric contact elements are indicated by dashed lines.
Figure 7B:
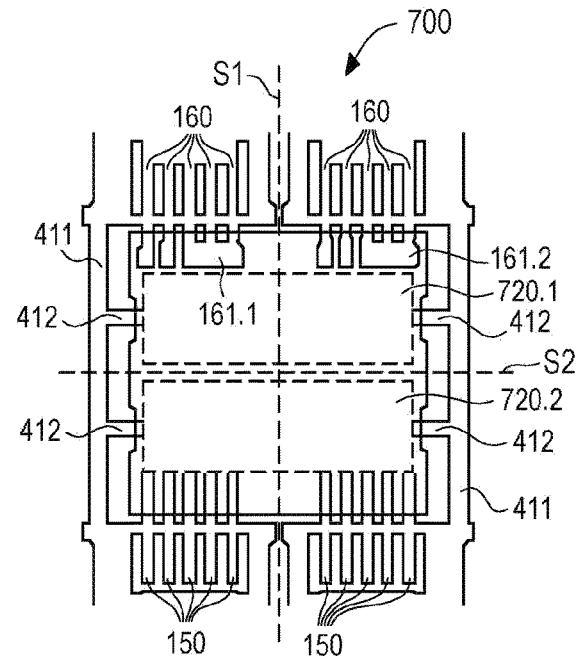
FIG. 7B is a top view of the semiconductor chip package 700 during a stage of manufacture after bonding the semiconductor chips onto the die pad of a leadframe and before encapsulating and separating the leadframe.

FIGS. 7A and 7B illustrate a further example of a semiconductor chip package 700. The semiconductor chip package 700 may be similar to the semiconductor chip package 500 with the exception that a first die pad 710.1 and a second die pad 710.2 are arranged in the longitudinal X direction rather than in the transversal Y dimension as in package 500. Again, each semiconductor chip 720.1, 720.2 may implement one monolithically integrated semiconductor device, e.g. power transistor, thereby these devices may be identical or different. As apparent from FIG. 7B, the semiconductor chips 720.1, 720.2 may each overlay partly or completely the die pads 710.1 and 710.2, respectively. The first semiconductor chip 720.1 and the second semiconductor chip 720.2 are arranged side-by-side with respect to direction Y which is perpendicular to the direction X of the first side face 140.1 and the second side face 140.2 of the encapsulation body 140.

In this embodiment, footprint symmetry line S1 may also be a symmetry line for the leadframe but is not a symmetry line in terms of functionality of the semiconductor chip package 700. More specifically, the semiconductor chip package 700 may comprise two power semiconductor devices of the same functionality, wherein a symmetry line S2 of functionality may extend parallel to and in the middle between the first side face 140.1 and the second side face 140.2 of the encapsulation body 140.

Figure 8A:
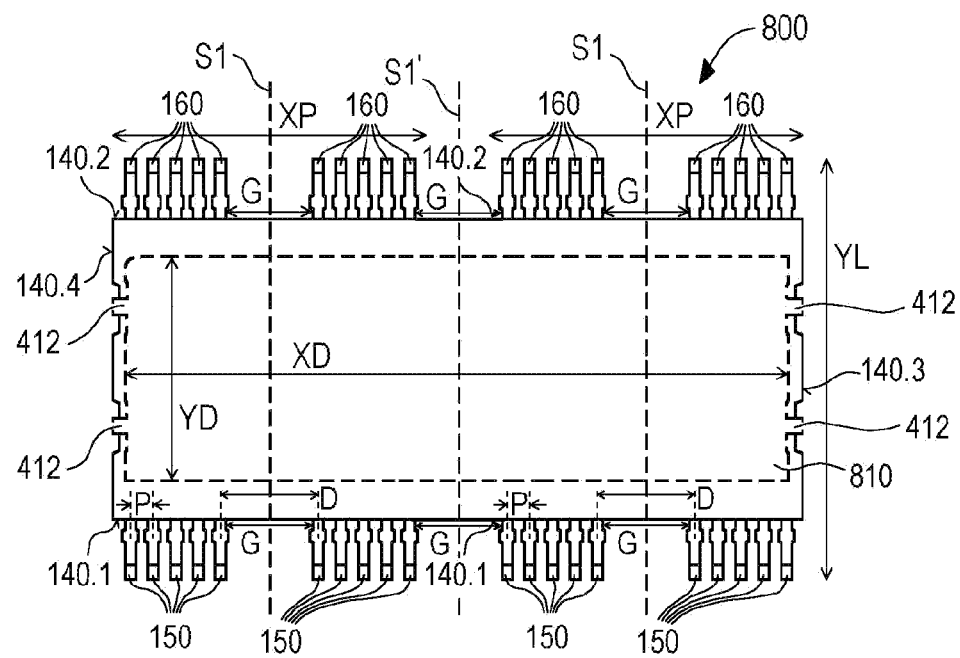
FIG. 8A is a bottom view (footprint) of an example of a semiconductor chip package 800, wherein the contour of a die pad is indicated by dashed lines.

FIG. 8A illustrates the footprint of a semiconductor chip package 800. Semiconductor chip package 800 may be identical to the semiconductor chip package 400 with the exception that semiconductor chip package 800 illustrates an example having four groups of the first electrical contact elements 150 and four groups of the second electrical contact elements 160. Again, a single die pad 810 may be used, or the carrier may be configured to be designed by a number of 2, 3 or 4 separated die pads (not shown in FIG. 8A).

Package dimensions G, D, E and/or P indicative of the recurring elementary footprint geometry and leadframe (or die pad) dimension YD may be identical as mentioned above, and the leadframe (or die pad) dimensions XD may scale accordingly. That is, the die pad 810 may have a length of, e.g., XD=33.5 mm in the X direction and may have a transversal dimension of, e.g., YD=10.7 mm in the Y direction. Again, these figures are mere examples, and the die pad dimensions XD, YD can be equal to or greater than or smaller than these figures, which themselves may vary by, e.g., plus/minus 80%, 50%, 30%, or 10%. The die pad 810 may have an area size of, e.g., 358 mm$^2$, with a variation of, e.g., ±20%.

Figure 8B:
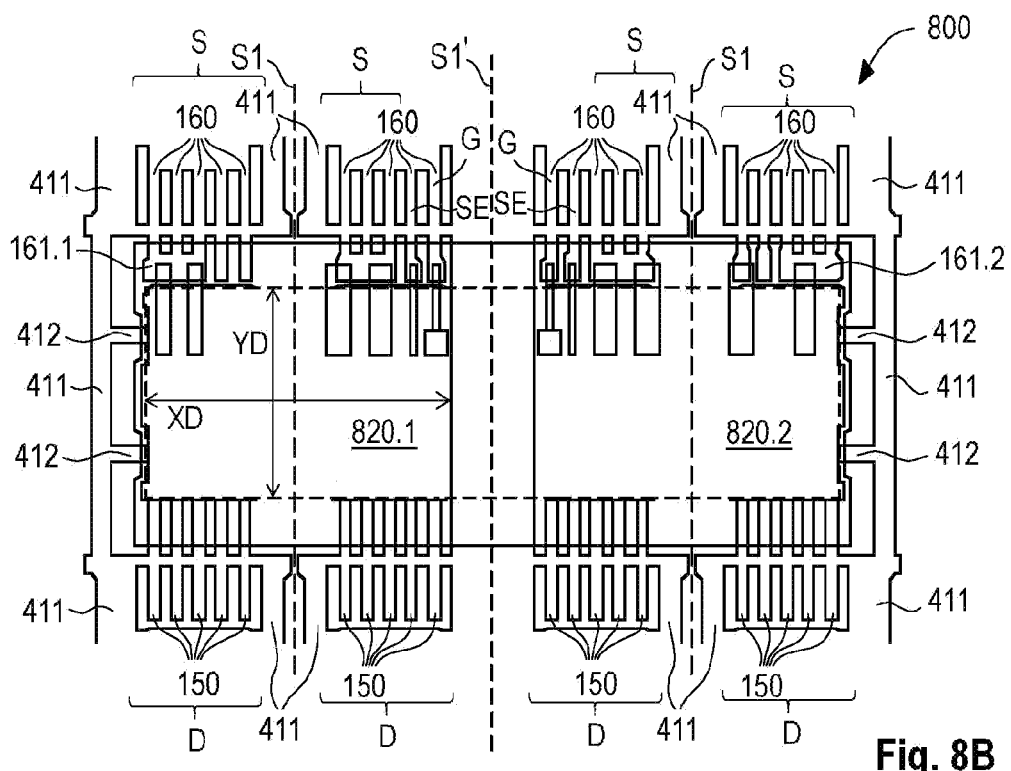
FIG. 8B is a top view of the semiconductor chip package 800 during a stage of manufacture after bonding the semiconductor chips onto the die pad of a leadframe and before encapsulating and separating the leadframe.

FIG. 8B is a view on the semiconductor chip package 800 during a stage of manufacturing similar to FIG. 4B. In this example, two semiconductor chips 820.1 and 820.2 may be mounted on the (e.g. single) die pad 810.

The first semiconductor chip 820.1 and the second semiconductor chip 820.2 may each implement one semiconductor device, which may be monolithically integrated in each of the semiconductor chips 820.1 and 820.2, respectively. These two semiconductor devices may have the same or different electrical functionalities. Symmetry lines S1 may represent at least a "local" symmetry in view of footprint geometry (or leadframe geometry), while symmetry line S1' may represent a global symmetry in view of footprint geometry (or leadframe geometry) and, e.g., in view of package functionality.

The semiconductor chips 820.1, 820.2 may be arranged in a mirrored orientation with respect to symmetry line S1'. In this case (i.e. "single die pad with mirrored dual chip"), a possible wiring for a two switch semiconductor chip package is illustrated in FIG. 8B. All first electrical contact elements 150 are referenced by D may be connected to the drain (D) electrodes of semiconductor chips 820.1, 820.2, wherein the drain electrodes are bonded to the (single) die pad 810. All second electrical contact elements 160 of the left outer group of the second electrical contact elements 160 are referenced by S as they may be connected to the source (S) electrode of the first semiconductor chip 820.1. All second electrical contact elements 160 of the right outer group of the second electrical contact elements 160 are referenced by S as they may be connected to the source (S) electrode of the second semiconductor chip 820.2. As to the two inner groups of the second electrical contact elements 160, the opposing inner electrical contact elements are referenced by G as they may be connected to the respective gate (G) electrodes of the semiconductor chips 820.1 and 820.2, respectively, and neighboring second electrical contact elements 160 are referenced by SE as they may each be connected as sense (SE) lines to the source electrodes of the semiconductor chips 820.1 and 820.2, respectively. As mentioned above, it is also possible that the second contact elements are bonded to the (single) die pad 810 while first contact elements are used as SE and/and or S leads. Further, throughout the description, it is possible that semiconductor chip(s) 820.1 and 820.2 are source-down devices so that the (single) die pad 810 is connected to source (S) contacts of the semiconductor chips 820.1, 820.2 while drain (D) contacts and/or SE lines are, e.g. connected to the second contact elements 160.

Figure 9:
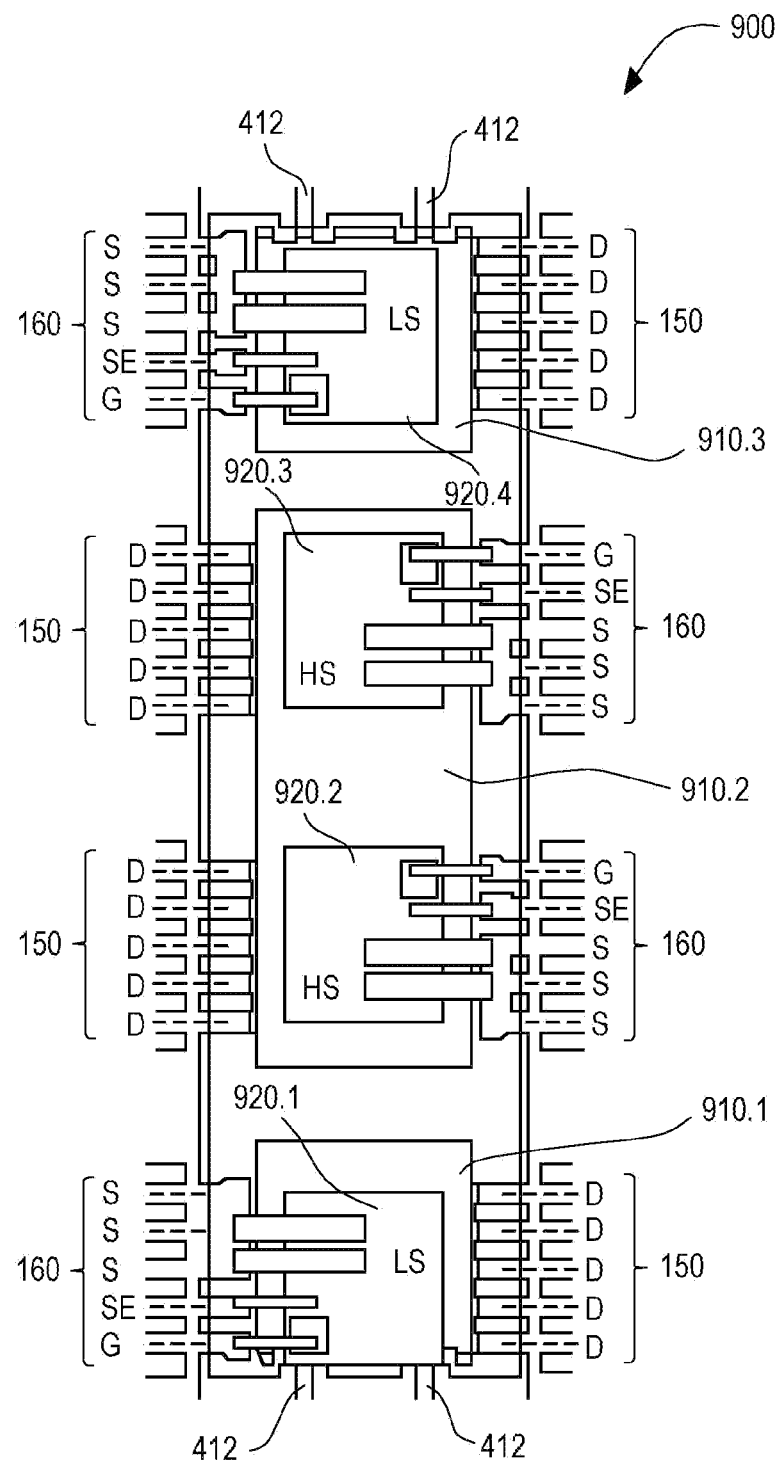
FIG. 9 is a top view of an example of a semiconductor chip package 900 during a stage of manufacture after bonding the semiconductor chips onto die pads of a leadframe and before encapsulating and separating the leadframe.

FIG. 9 is a view on a semiconductor chip package 900 during a stage of manufacturing similar to FIG. 8B. The semiconductor chip package 900 may have the same geometry in view of footprint as the semiconductor package 800, i.e. may include the same recurring elementary footprint pattern of 4 groups of first and second electrical contact elements 150, 160. Reference is made to the above description in order to avoid reiteration. However, the semiconductor chip package 900 distinguishes from semiconductor chip package 800 in terms of the number of die pads of the carrier and the number of semiconductor chips.

More specifically, the semiconductor chip package 900 may include a left side die pad 910.1, a center die pad 910.2, and a right side die pad 910.3. Further, the semiconductor chip package 900 may include a first semiconductor chip 920.1, a second semiconductor chip 920.2, a third semiconductor chip 920.3, and a fourth semiconductor chip 920.4.

The left side die pad 910.1, the center die pad 910.2 and the right side die pad 910.3 are not interconnected by ridges (tiebars) of the leadframe, while ridges (tiebars) 412 are present at the left side face (corresponding to side face 140.4) and right side face (corresponding to side face 140.3) of the semiconductor chip package 900. Hence, as a general feature, while in a multi die pad package, the tiebar periodicity of the leadframe may correspond to the longitudinal package dimension XP, the recurring elementary footprint periodicity may show up within each semiconductor package and may extend over a multi package length (or the entire length) of the leadframe. This inter package and intra package recurring elementary footprint periodicity of the leadframe (i.e. the consistent periodicity of the external contact terminals along the leadframe in terms of dimensions D, P, E) allows for the low cost size scaling property of the semiconductor chip packages described herein.

Returning to FIG. 9, the first semiconductor chip 920.1 may be mounted on the left side die pad 910.1, the second and third semiconductor chips 920.2, 920.3 may be commonly mounted on the center die pad 910.2, and the fourth semiconductor chip 920.4 may be mounted on the right side die pad 910.3. Each semiconductor chip 920.1, 920.2, 920.3, 920.4 may implement one semiconductor device (e.g. transistor), which may be monolithically integrated in each of the semiconductor chips 920.1, 920.2, 920.3, 920.4, respectively. That is, the semiconductor chip package 900 may represent a "three die pads four switches" package.

By way of example, the semiconductor chip package 900 may implement two half bridges. The semiconductor chips 920.1 and 920.2 may implement the low side (LS) transistor and high side (HS) transistor of a first half bridge, respectively, and the semiconductor chips 920.3 and 920.4 may implement the HS transistor and LS transistor of a second half bridge. That is, the drain (D) of both HS transistors may be mounted on the common center die pad 910.2, while the left side and right side die pads 910.1, 910.3 may be connected to the drains (D) of the HS transistors of semiconductor chips 920.1 and 920.3, respectively. It is to be noted that the two HS transistors may also be monolithically integrated in one semiconductor chip which then replaces the semiconductor chips 920.2 and 920.3.

Regardless of the number of die pads and chips included in the semiconductor chip package, the footprints of the semiconductor chip packages 800 and 900 may be identical. Further, the footprint of "octa-design" semiconductor chip packages 800 and 900 may be identical to the composite footprint of two "quadruple-design" semiconductor chip packages 100, 400, 500, 600 700 when placed adjacent to each other.

Figure 10A:
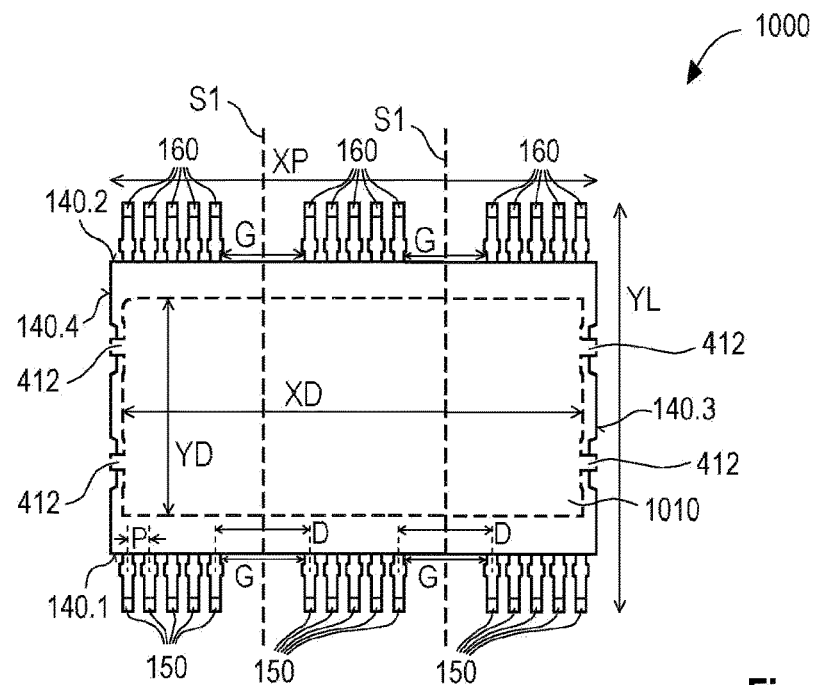
FIG. 10A is a bottom view (footprint) of an example of a semiconductor chip package 1000, wherein the contour of a die pad is indicated by dashed lines.

FIG. 10A illustrates a footprint of a semiconductor chip package 1000 having a "hexa-design", i.e. three groups of first electrical contact elements 150 and three groups of second electrical contact elements 160. Apart from this, semiconductor chip package 1000 may be similar to the semiconductor chip package 800 (i.e. may be a single die pad dual chip package, see also FIG. 10B).

Package dimensions G, D, E and P indicative of the recurring elementary footprint geometry and leadframe (or die pad) dimension YD may be identical as mentioned above, and the leadframe (or die pad) dimensions XD may scale accordingly. That is, the die pad 1010 may have a length of, e.g., XD=23.9 mm in the X direction and may have a transversal dimension of, e.g., YD=10.7 mm in the Y direction. Again, these figures are mere examples, and the die pad dimensions XD, YD can be equal to or greater than or smaller than these figures, which themselves may vary by, e.g., plus/minus 80%, 50%, 30%, or 10%. The die pad 1010 may have an area size of, e.g., 256 mm$^2$, with a variation of, e.g., ±20%.

Figure 10B:
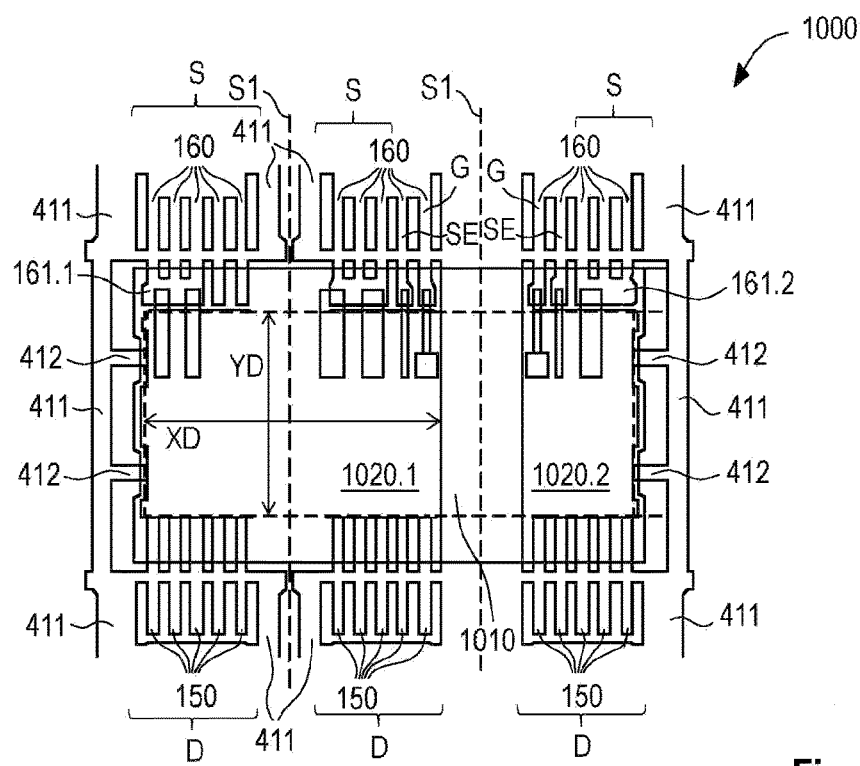
FIG. 10B is a top view of the semiconductor chip package 1000 during a stage of manufacture after bonding the semiconductor chips onto the die pad of a leadframe and before encapsulating and separating the leadframe.

FIG. 10B is a view on the semiconductor chip package 1000 during a stage of manufacturing similar to FIG. 8B. In this example, two semiconductor chips 1020.1 and 1020.2 may be mounted on the (e.g. single) die pad 1010.

The semiconductor chips 1020.1, 1020.2 may be arranged in a mirrored orientation, and a possible wiring for a two switch semiconductor chip package 1000 is illustrated in FIG. 10B. Briefly, all first electrical contact elements 150 may be connected to the drain (D) electrodes of semiconductor chips 1020.1, 1020.2, wherein the drain electrodes are bonded to the (single) die pad 1010. The second electrical contact elements 160 may be connected to the source (S) electrode, gate (G) electrode and sense (SE) electrode on the first and second semiconductor chips 1020.1, 1020.2 as, e.g., indicated in FIG. 10B.

The regularity or self-similarity of the package footprint of the "quadruple-design" semiconductor chip packages 100, 400, 500, 600 700, the "octa-design" semiconductor chip packages 800, 900 and the "hexa-design" semiconductor chip package 1000 further allows for minimizing package manufacturing costs in terms of chip costs. Generally, the ohmic resistance of a semiconductor transistor chip should be as small as possible to enhance the performance. As the chip area size scales with inverse ohmic resistance, large chip sizes (i.e. large XD, YD) are favorable. However, the greater the chip size, the smaller is the fabrication yield, which, on the other hand, increases chip manufacturing costs. Therefore, there is a trade-off between performance (in terms of chip size or low ohmic resistance) and chip costs. The regularity or self-similarity of the package footprint allows to design packages having an optimum number of semiconductor chips in terms of the trade-off between performance and costs. By way of example, when the yield for a given chip size is increased, the two semiconductor chips 920.2, 920.3 may be replaced by a single chip of the same functionality but larger semiconductor area for each switch, since the gap between the two semiconductor chips 920.2, 920.3 may then be utilized for lowering the ohmic resistance of the switches.

Figure 11:
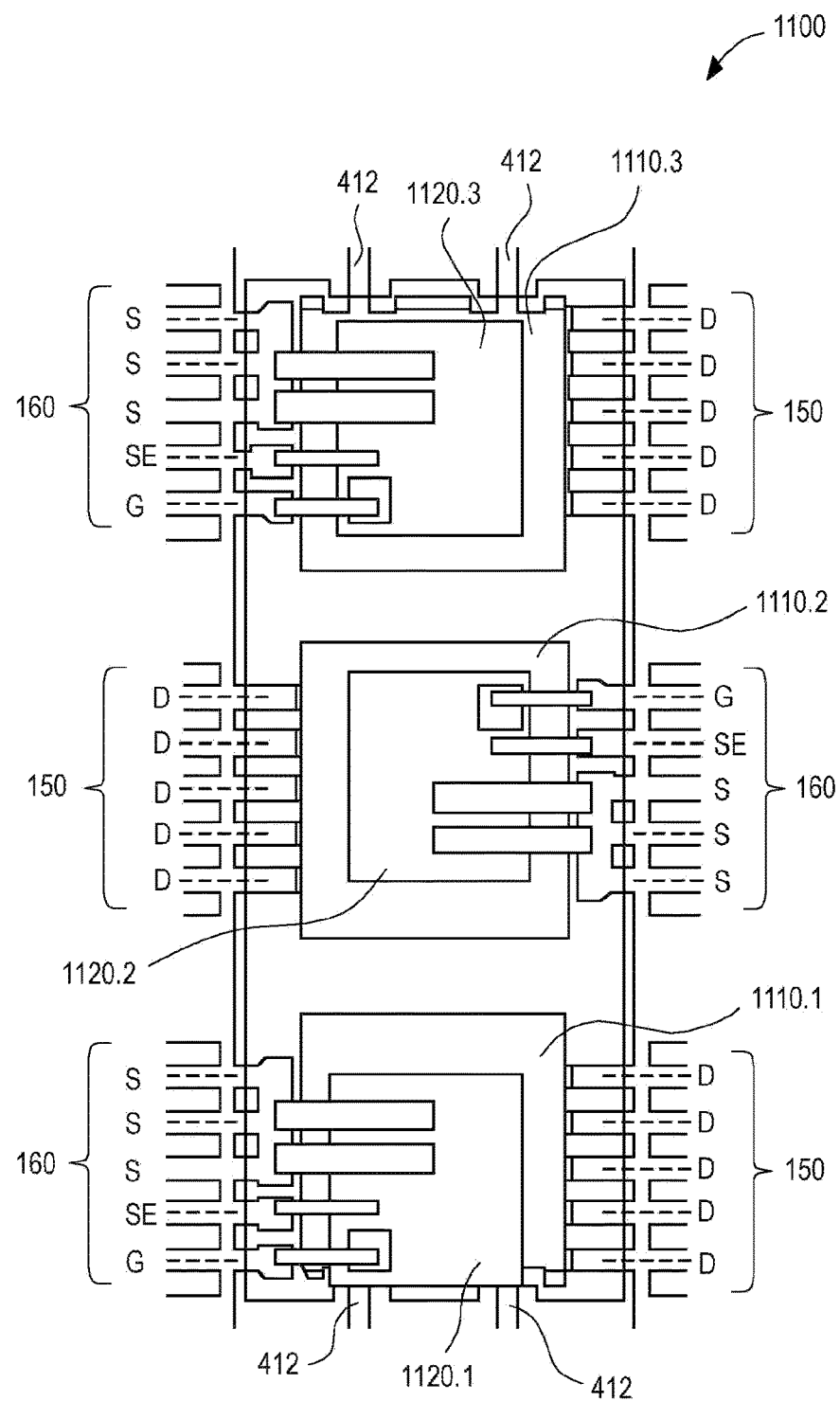
FIG. 11 is a top view of an example of a semiconductor chip package 1100 during a stage of manufacture after bonding the semiconductor chips onto die pads of a leadframe and before encapsulating and separating the leadframe.

FIG. 11 is a view on a semiconductor chip package 1100 during a stage of manufacturing similar to FIG. 10B. The semiconductor chip package 1100 may have the same geometry in view of footprint as the semiconductor package 1000, i.e. may include the same recurring elementary footprint pattern of 3 groups of first and second electrical contact elements 150, 160. Reference is made to the above description in order to avoid reiteration. However, the semiconductor chip package 1100 distinguishes from semiconductor chip package 1000 in terms of the number of die pads of the carrier and the number of semiconductor chips.

More specifically, the semiconductor chip package 1100 may include a left side die pad 1110.1, a center die pad 1110.2, and a right side die pad 1110.3. These die pads 1110.1 to 1110.3 are not interconnected by tiebars. Further, the semiconductor chip package 1100 may include a first semiconductor chip 1120.1, a second semiconductor chip 1120.2, and a third semiconductor chip 1120.3.

The first semiconductor chip 1120.1 may be mounted on the left side die pad 1110.1, the second semiconductor chip 1120.2 may be mounted on the center die pad 1110.2 and the third semiconductor chip 1120.3 may be mounted on the right side die pad 1110.3. Hence, the semiconductor chip package 1100 may represent a "three die pads three switches" package.

Figure 12:
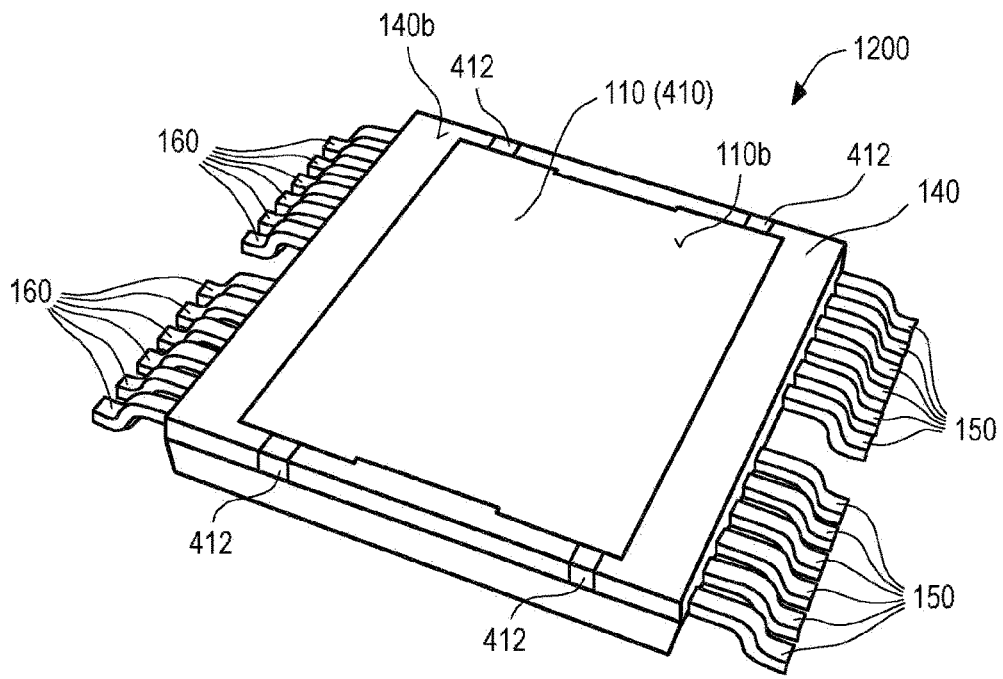
FIG. 12 is a perspective view of an example of a semiconductor chip package 1200 showing a backside of a die pad exposed from an encapsulation body at the top main face of the semiconductor chip package.

FIG. 12 is a perspective view of an example of a semiconductor chip package 1200. In semiconductor chip package 1200, the backside of the carrier 110 (e.g. die pad 410) is exposed from the encapsulation body 140 at the second main face 140b thereof. To provide for a high heat removal capacity, the second main surface 110b of the carrier 110 exposed from the encapsulation body 140 may have an area size equal to or greater than 60%, 70%, 80%, or 90% of an area size of the second main face 140b of the encapsulation body 140. The perspective view of FIG. 12 corresponds to the package design shown in FIG. 2 and may be applied for all semiconductor chip packages 100, 200, 400 to 1100 as described herein (however, for the semiconductor chip packages 500, 600, 700, 900 and 1100 the view of FIG. 12 would change to illustrate the split type design of the carrier 110).

Figure 13:
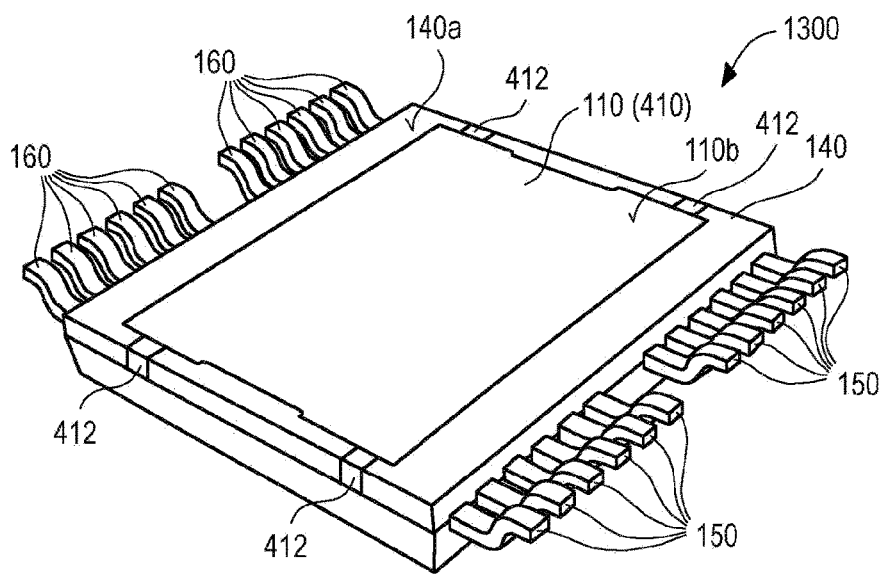
FIG. 13 is a perspective view of an example of a semiconductor chip package 1300 showing a backside of a die pad exposed from an encapsulation body at the bottom main face of the semiconductor chip package.

FIG. 13 is a perspective view of an example of a semiconductor chip package 1300. In semiconductor chip package 1300, the backside of the carrier 110 (e.g. die pad 410) is exposed from the encapsulation body 140 at the first main face 140a thereof. The second main surface 110b of the carrier 110 exposed from the encapsulation body 140 may have an area size equal to or greater than 60%, 70%, 80%, or 90% of an area size of the first main face 140a of the encapsulation body 140. The perspective view of FIG. 13 corresponds to the package design shown in FIG. 3 and may be applied for all semiconductor chip packages 100, 300 to 1100 as described herein (however, for the semiconductor chip packages 500, 600, 700, 900, and 1100 the view of FIG. 13 would change to illustrate the split type design of the carrier 110).

Thus, an example of a semiconductor chip package described herein includes a carrier including one or a plurality of die pads; one or a plurality of semiconductor chips disposed over the one or a plurality of die pads; an encapsulation body encapsulating the one or a plurality of semiconductor chips, the encapsulation body having a first main face, a second main face opposite the first main face and a plurality of side faces; first electrical contact elements protruding out of the encapsulation body through a first side face of the encapsulation body; second electrical contact elements protruding out of the encapsulation body through a second side face of the encapsulation body opposite the first side face; wherein a plurality of groups of the first electrical contact elements are spaced apart by a distance D that is greater than a distance P between adjacent first electrical contact elements within each group of first electrical contact elements, wherein distances D and P are measured between center axes of electrical contact elements; and wherein a second main surface of the carrier opposite the first main surface of the carrier is at least partially exposed from the encapsulation body.

In this exemplary semiconductor chip package, when the number of die pads is 1, the number of semiconductor chips may be 1 or 2, or when the number of die pads is 2, the number of semiconductor chips may be 2, or when the number of die pads is 3, the number of semiconductor chips may be 3 or 4.

In this exemplary semiconductor chip package, the number of groups of first electrical contact elements may be 2, 3 or 4.

In this exemplary semiconductor chip package, each group of first electrical contact elements may comprise at least one first electrical contact element connected to a first load electrode of a semiconductor chip and at least one other first electrical contact element connected to a control electrode of the semiconductor chip.

Further, it is to be noted that all semiconductor chip packages described herein may be designed to have a longitudinal symmetry line in X direction in view of footprint design. This longitudinal symmetry line may coincide with the central longitudinal axis of the leadframe (i.e. the die pad(s) of the leadframe). That is, this longitudinal symmetry line may extend perpendicular to the transversal S1 or S1' symmetry line(s) and may cause that each group of first electrical contact elements is mirrored onto a corresponding group of second electrical contact elements.

Although specific aspects have been illustrated and described herein, it will be appreciated by those of ordinary skill in the art that a variety of alternate and/or equivalent implementations may be substituted for the specific aspects shown and described without departing from the concept of the disclosure. This application is intended to cover any adaptations or variations of the specific aspects discussed herein. Therefore, it is intended that this disclosure be limited only by the claims and the equivalents thereof.

What is claimed is:

1. A semiconductor chip package, comprising:
    a carrier;
    a power semiconductor chip disposed over a first main surface of the carrier;
    an encapsulation body encapsulating the power semiconductor chip, the encapsulation body having a first main face, a second main face opposite the first main face and a plurality of side faces;
    first electrical contact elements electrically coupled to the power semiconductor chip and protruding out of the encapsulation body through a first side face of the encapsulation body; and
    second electrical contact elements electrically coupled to the power semiconductor chip and protruding out of the encapsulation body through a second side face of the encapsulation body opposite the first side face,
    wherein a first group of the first electrical contact elements and a second group of the first electrical contact elements are spaced apart by a distance D that is greater than a distance P between adjacent first electrical contact elements of the first group and between adjacent first electrical contact elements of the second group, wherein distances D and P are measured between center axes of electrical contact elements, wherein a second main surface of the carrier opposite the first main surface of the carrier is at least partially exposed from the encapsulation body, wherein the first electrical contact elements are integral with the carrier and electrically connected to a first load electrode of the power semiconductor chip, wherein the second electrical contact elements are separated from the carrier, wherein a first subset of the second electrical contact elements is electrically connected to a second load electrode of the power semiconductor chip, wherein a second subset of the second electrical contact elements is electrically connected to a control electrode of the power semiconductor chip, wherein the power semiconductor chip is a power transistor chip or a power diode chip.

2. The semiconductor chip package of claim 1, wherein the semiconductor chip package is configured as a surface mounting device, and wherein a footprint of the semiconductor chip package has a footprint symmetry line extending perpendicular to the first side face and the second side face and intersecting the first side face in the middle of the distance D.

3. The semiconductor chip package of claim 1, wherein the distance D is an integer multiple of the distance P.

4. The semiconductor chip package of claim 1, wherein the encapsulation body further comprises a third side face and a fourth side face opposite the third side face, and wherein the third side face and the fourth side face are void of any electrical contact elements.

5. The semiconductor chip package of claim 1, wherein the first group of the first electrical contact elements and the second group of the first electrical contact elements are each spaced apart from a respective corner of the encapsulation body by a distance of D/2.

6. The semiconductor chip package of claim 1, wherein the semiconductor chip package comprises two power semiconductor devices of a same functionality, and wherein a symmetry line of functionality extends perpendicular to the first side face and the second side face and intersecting the first side face in the middle of the distance D.

7. The semiconductor chip package of claim 1, wherein the semiconductor chip package comprises two power semiconductor devices of a same functionality, and wherein a symmetry line of functionality extends parallel to and in the middle between the first side face and the second side face.

8. The semiconductor chip package of claim 1, wherein a part of the second main surface of the carrier exposed from the encapsulation body has an area size equal to or greater than 60% of an area size of the first or second main face of the encapsulation body.

9. The semiconductor chip package of claim 1, wherein the carrier comprises a die pad of a leadframe and the electrical contact elements comprise leads of the leadframe.

10. The semiconductor chip package of claim 9, wherein the second electrical contact elements form integral parts of the die pad.

11. The semiconductor chip package of claim 1, wherein parts of the first and/or second electrical contact elements protruding out of the encapsulation body are bent in a direction towards the first main face of the encapsulation body.

12. The semiconductor chip package of claim 1, wherein parts of the electrical contact elements protruding out of the encapsulation body are bent in a direction towards the second main face of the encapsulation body.

13. A semiconductor chip package, comprising:
a carrier;
a first semiconductor chip and a second semiconductor chip disposed over a first main surface of the carrier;
an encapsulation body encapsulating the first semiconductor chip and the second semiconductor chip, the encapsulation body having a first main face, a second main face opposite the first main face and a plurality of side faces;
first electrical contact elements each electrically coupled to at least one the first semiconductor chip and the second semiconductor chip and protruding out of the encapsulation body through a first side face of the encapsulation body; and
second electrical contact elements each electrically coupled to at least one the first semiconductor chip and the second semiconductor chip and protruding out of the encapsulation body through a second side face of the encapsulation body opposite the first side face,
wherein a first group of the first electrical contact elements and a second group of the first electrical contact elements are spaced apart by a distance D that is greater than a distance P between adjacent first electrical contact elements of the first group and between adjacent first electrical contact elements of the second group, wherein distances D and P are measured between center axes of electrical contact elements,
wherein a second main surface of the carrier opposite the first main surface of the carrier is at least partially exposed from the encapsulation body.

14. The semiconductor chip package of claim 13, wherein the semiconductor chip package is configured as a surface mounting device, and wherein a footprint of the semiconductor chip package has a footprint symmetry line extending perpendicular to the first side face and the second side face and intersecting the first side face in the middle of the distance D.

15. The semiconductor chip package of claim 13, wherein the first semiconductor chip and the second semiconductor chip are arranged side-by-side with respect to a direction of the first side face and the second side face.

16. The semiconductor chip package of claim 13, wherein the first semiconductor chip and the second semiconductor chip are arranged side-by-side with respect to a direction perpendicular to a direction of the first side face and the second side face.

17. A semiconductor chip package, comprising:
a carrier including a plurality of die pads;
a plurality of semiconductor chips disposed over a first main surface of the carrier;
an encapsulation body encapsulating the plurality of semiconductor chips, the encapsulation body having a first main face, a second main face opposite the first main face and a plurality of side faces;
first electrical contact elements protruding out of the encapsulation body through a first side face of the encapsulation body; and
second electrical contact elements protruding out of the encapsulation body through a second side face of the encapsulation body opposite the first side face, wherein a plurality of groups of the first electrical contact elements are spaced apart by a distance D that is greater than a distance P between adjacent first electrical contact elements within each group of the first electrical contact elements, wherein distances D and P are measured between center axes of electrical contact elements, wherein a second main surface of the carrier opposite the first main surface of the carrier is at least partially exposed from the encapsulation body.

18. The semiconductor chip package of claim 17, wherein the number of die pads is 2 and the number of semiconductor chips is 2, or wherein the number of die pads is 3 and the number of semiconductor chips is 3 or 4.

19. The semiconductor chip package of claim 17, wherein the number of groups of first electrical contact elements is 2, 3 or 4.

20. The semiconductor chip package of claim 17, wherein each group of first electrical contact elements comprises at least one first electrical contact element connected to a first load electrode of a semiconductor chip and at least one other first electrical contact element connected to a control electrode of the semiconductor chip.

* * * * *